(12) United States Patent
Coimbra et al.

(10) Patent No.: US 9,785,177 B1
(45) Date of Patent: Oct. 10, 2017

(54) SYMMETRICAL POSITIVE AND NEGATIVE REFERENCE VOLTAGE GENERATION

(71) Applicant: NXP B.V., Eindhoven (NL)

(72) Inventors: Ricardo Coimbra, Campinas (BR); Javier Mauricio Olarte Gonzalez, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/227,032

(22) Filed: Aug. 3, 2016

(51) Int. Cl.
*G05F 1/10* (2006.01)
*G05F 3/02* (2006.01)
*G05F 3/16* (2006.01)
*H03F 3/45* (2006.01)

(52) U.S. Cl.
CPC .......... *G05F 3/16* (2013.01); *H03F 3/45475* (2013.01); *H03F 2200/165* (2013.01); *H03F 2203/45248* (2013.01); *H03F 2203/45288* (2013.01)

(58) Field of Classification Search
CPC ......... H03F 2200/331; H03F 2200/261; H03F 3/45475; H03F 2200/03; H03F 2203/45138; H03F 3/4565; H03F 3/45941; H03F 3/45973; G05F 1/565; G05F 3/08; G05F 3/16
USPC ................. 327/534, 538, 552, 565
See application file for complete search history.

(56) References Cited

U.S. PATENT DOCUMENTS

| | | | |
|---|---|---|---|
| 6,229,379 B1 | 5/2001 | Okamoto | |
| 6,424,202 B1 | 7/2002 | Bartlett | |
| 8,581,661 B2* | 11/2013 | Friend | H03F 3/187 330/254 |
| 2011/0169990 A1* | 7/2011 | Higuchi | H03M 1/664 348/302 |

OTHER PUBLICATIONS

David Jacquet, et al., "A 3GHz Dual Core Processor ARM Cortex-A9 in 28nm UTBB FD-SOI CMOS With Ultra-Wide Voltage Range and Energy Efficiency Optimization", IEEE Journal of Solid-State Circuits, Apr. 2014, pp. 15 and vol. 49.

* cited by examiner

*Primary Examiner* — Lincoln Donovan
*Assistant Examiner* — Diana J Cheng

(57) ABSTRACT

In an embodiment, an electronic device includes a first amplifier having a non-inverting input configured to receive a reference voltage and an inverting input coupled to a first output node, where the first amplifier is configured to produce a first output voltage at the first output node. The electronic device also includes a second amplifier having a non-inverting input coupled to a ground reference level, and an inverting input coupled to the first output node via a first resistor and to a second output node via a second resistor, where the second amplifier is configured to produce a second output voltage at the second output node.

14 Claims, 2 Drawing Sheets

300

400

US 9,785,177 B1

SYMMETRICAL POSITIVE AND NEGATIVE REFERENCE VOLTAGE GENERATION

FIELD

This disclosure relates generally to electronic circuits and devices, and more specifically, to circuits for generating symmetrical positive and negative reference voltages

BACKGROUND

In semiconductor design, separate voltage supplies can be connected to NMOS and PMOS bulk regions in triple-well CMOS technologies. Modification of these voltages with respect to the primary power and ground supplies is called well-biasing. In some applications, these voltages may be modulated to provide a back-bias voltage ("back biasing"), aiming to increase or decrease threshold voltage (Vth) in order to adjust the trade-off relation between performance and power dissipation of the device.

Generally speaking, back-biasing techniques range from the fairly basic (e.g., with a common bias for the whole chip) to the very sophisticated (e.g., a separate bias for each block). The available techniques also depend on technology-specific characteristics. For example, Silicon-over-Insulator (SOI) technologies provide a number of different transistor device options. One such option is called LVT or flipped-well transistors which consists of a PMOS transistor having P-type well (bulk) underneath its insulator layer and a NMOS transistor having N-type well (bulk) underneath its insulator layer. The forward-back-biasing (FBB) technique applied to logic gate regions, commonly referred to as Sea-of-Gates (SoG), built with flipped-well transistors (LVT), is based on biasing the P and N wells underneath the PMOS and NMOS devices, respectively, with symmetrically matched negative and positive voltage levels that are normally selectable or programmable.

The inventors hereof have recognized that various applications require that transitions between different biasing levels be achieved with no stop to logic switching. In those applications, P and N well voltages must be symmetrically biased at all times (including during well bias level transitions) in order to avoid timing violations. Moreover, it is highly desirable for level transitions to be as fast as possible in order to optimize product performance.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Systems and methods for generating positive and negative reference voltages are disclosed. In various embodiments, a circuit generates precise and symmetrically matched positive and negative reference voltages with programmable levels. In many cases, these embodiments result in smooth transitions after a level selection change, in the form of "symmetrical ramps" with a fixed |dv/dt|.

As described in more detail below, a reference current in connection with a resistor ladder and a multiplexer (MUX) may generate a range of programmable reference levels ($V_R$). The MUX's output is driven to the input of a first amplifier with high DC gain and output current modulus limited to a current of a selected value.

A capacitor is connected to the output of the first amplifier which, in combination with the maximum current limit provided by the amplifier, results in its output voltage having fixed dv/dt transition behavior. The output voltage of the first amplifier may already be used as the positive reference voltage (+VREF). Alternatively, the output of the first amplifier may be driven to the input of a following amplifier stage with appropriate gain. Typically, the gain of this following amplifier stage would be made approximately equal to 1 in which case it may be referred to as buffer stage (in other embodiments, however, such a "buffer stage" may alternatively have other gain values).

Then, +VREF is produced at the output of this following stage (e.g. buffer stage). The inclusion of this following stage serves to decouple +VREF node from the output node of the first amplifier where the capacitor is connected. A symmetrically matched negative voltage reference (−VREF) is produced by an inverter amplifier configuration. Such an inverter amplifier configuration may include a resistor divider connected between +VREF and −VREF, as well as a second amplifier connected in a closed-loop configuration forcing a GND potential to appear at a given tap of the resistor divider.

The second amplifier is made fast enough to continuously track variations of the first amplifier output voltage therefore maintaining +VREF and −VREF symmetrically matched at all times. Resistor values determine the proportion between +VREF's and −VREF's absolute values. A low-pass filter may be placed at the MUX's output to improve transient signal behavior at the first amplifier input.

Figure 1:
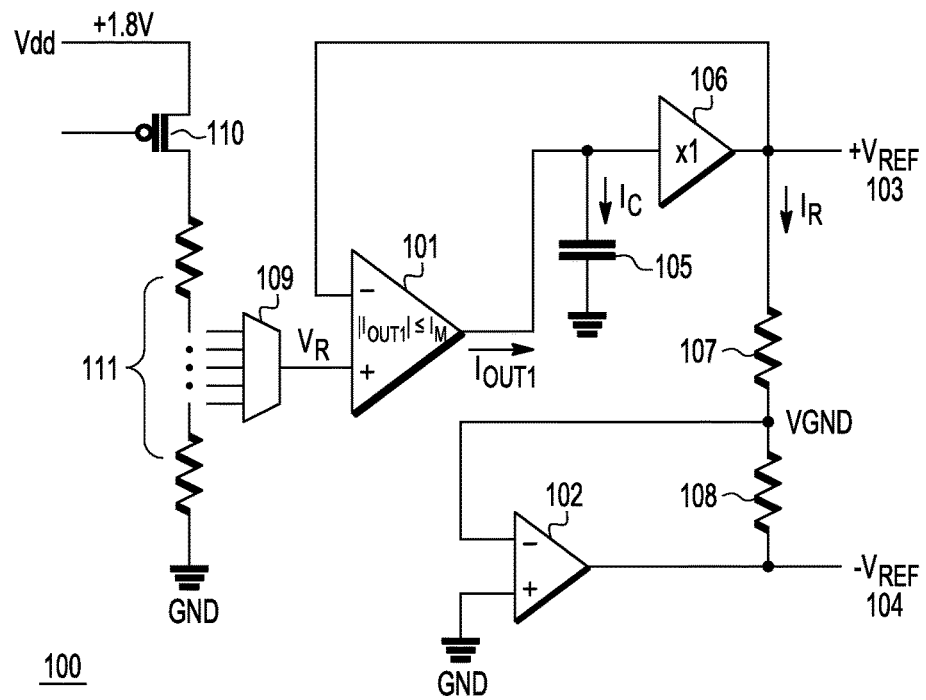
FIG. 1 is a diagram of an example of a circuit for generating positive and negative reference voltages according to some embodiments.

To better illustrate the foregoing, FIG. 1 is a diagram of an example of circuit 100 for generating positive and negative reference voltages according to some embodiments. A reference current source formed by Vdd (e.g., +1.8 V) and PMOS transistor 110 is coupled to resistor ladder 111, which is in turn coupled to a ground reference voltage or level ("ground"). Alternatively, a reference voltage (VR_max) may be applied directly on the top terminal of the resistor ladder. As such, a plurality of different reference voltages appear between the various nodes of resistor ladder 111. Multiplexer (MUX) 109 is coupled to those nodes and, in response to a control signal, selects one of those voltages to be output as $V_R$.

Circuit 100 includes first amplifier 101 and second amplifier 102, the latter implemented as an inverter amplifier. The non-inverting input of first amplifier 101 is configured to receive $V_R$, and the inverting input of first amplifier 101 is coupled to first output node 103. Amplifier 101 provides an output current $I_{OUT1}$ such that $|I_{OUT1}| \leq I_M$, where the value of maximum output current $I_M$ may be selected, for example, by design of one or more current sources within amplifier 101. The output reference voltage produced by amplifier 101 appears at the first output node 103 as +VREF.

Circuit 100 also includes capacitor 105 coupled to the output of amplifier 101 at an intermediate node, which is isolated from the first output node 103 by buffer 106. In combination with maximum output current $I_M$, the capacitance ($C_1$) of capacitor 105 in effect causes amplifier 101 to operate with a slew rate |dv/dt| equal to $I_M/C_1$.

Generally, +VREF is equal to $V_R$. The feedback arrangement of first amplifier 101 causes the same voltage to appear in both its inverting and non-inverting inputs. In some cases, buffer 106 may introduce some amount of level shifting. For example, when buffer 106 is implemented as an emitter-follower circuit, there is a voltage drop at the output corresponding to the gate-to-source voltage (Vgs). Yet, by creating the feedback loop at the first output node 103 after buffer 106, such an offset is automatically corrected.

When $V_R$ varies in a step fashion, the different input voltage at the non-inverting input of first amplifier 101 produces the amplifier's output current $I_{OUT1}$. But the value of $I_{OUT1}$ is limited by $I_M$, therefore capacitor 105 is charged or discharged with current $I_C$ equal to $+I_M$ or $-I_M$. Because $I_C$ is constant during nearly all the transition, this results in a voltage ramp with a constant derivative dv/dt given by $I_M/C$ at the node with the capacitor. Hence, near the very end of the transition, $I_{OUT1}$ will eventually lower until output finally settles. By making the amplifier's gain is very high, current $I_{OUT1}$ would only start to fall beyond a point where the difference between voltages at the input was already very small. That's why we may consider dv/dt constant over all (or the major part of) the transition.

In various embodiments, first amplifier 101 may have a number of different topologies with different selected slew rates. For example, a folded-cascode amplifier with a differential input may include a folding stage followed by a capacitor. In this example, there is an intrinsic slew rate limitation given by current sources within the amplifier. Also, capacitor 105 may be connected in different ways on those different topologies while still determining together with current limit $I_M$ the slew rate limitation. For instance, capacitor 105 may be connected in a Miller configuration in some topologies.

In another example, current $I_M$ from some internal current source together with capacitor 105 may determine the slew-rate limitation (dv/dt). There are different ways to implement this feature: one may connect capacitor 105 to other nodes other than GND, and another may connect capacitor 105 as a Miller capacitance. In either case, the result in slew-rate limitation is the same. More generally, the output slew-rate may be made proportional to the maximum current over C. This also applies to −VREF when resistors are different producing different (but proportional) reference voltages and slew rates.

Second amplifier 102 is in an inverted amplifier configuration. The non-inverting input of amplifier 102 is coupled to ground, and the inverting input of amplifier 102 is coupled to the first output node 103 via first resistor 107. The inverting input of amplifier 102 is also coupled to a second output node 104 via second resistor 108.

The node between the first and second resistors 107 and 108 creates a virtual ground VGND, and the second output node produces another output voltage at the second output node 104 equal to −VREF, which is symmetric with respect to +VREF at all times, includes during transitions between different values of $V_R$ selected via MUX 109. To generate symmetrical reference voltages in respect to another potential other than ground, the non-inverting input of amplifier 102 may be connected to other potential instead of ground.

In some cases, second amplifier 102 may be implemented as an operational transconductance amplifier (OTA). The response time of second amplifier 102, including any propagation delays, should be fast enough to match the value of |dv/dt|, which is limited in the frequency domain, in order to avoid adding any significant delays that would otherwise cause unacceptable asymmetries between +VREF and −VREF.

That is, some amount of delay always exists, meaning that −VREF will track +VREF with a non-zero delay in real applications. The fastest the second amplifier, the smaller this delay, therefore the second amplifier should be made fast enough to reduce this delay to an acceptable level.

Figure 2:
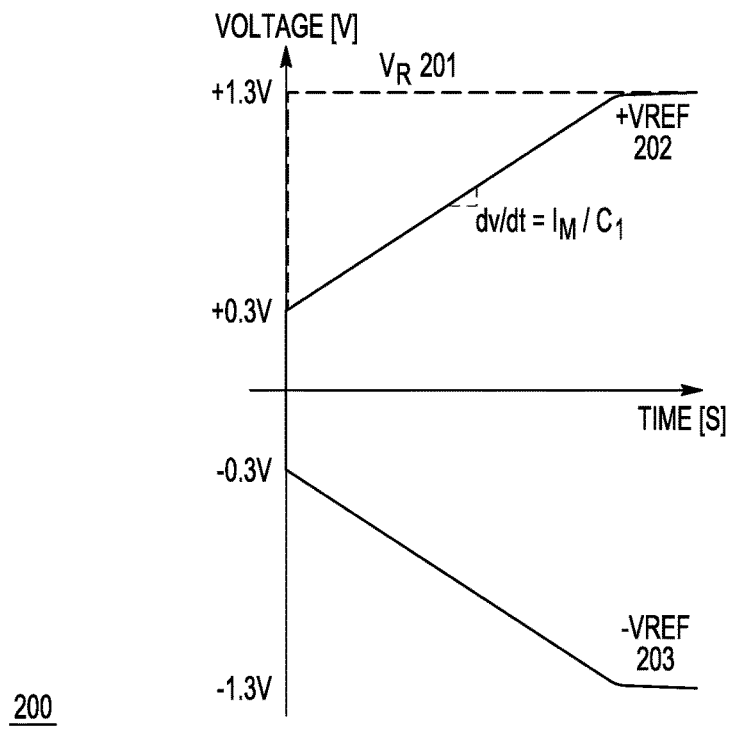
FIG. 2 is a graph illustrating, as an example, reference voltages output by the circuit of FIG. 1, according to some embodiments.

FIG. 2 is a graph 200 illustrating, as an example, reference voltages output by circuit 100 of FIG. 1, according to some embodiments. In the top portion of graph 200, curve 201 shows that $V_R$ varies as a step between +0.3 V and +1.3 V. For example, MUX 209 may receive a control signal that causes it to immediately (or very quickly) output a different voltage $V_R$ taken from a different node in resistor ladder 111.

Then, rather than attempting to follow the variation in $V_R$ as quickly as possible in a non-linear fashion, that would make it excessively difficult for the second amplifier 102 to maintain a symmetric −VREF output, curve 202 shows that +VREF increases linearly, with a fixed rate |dv/dt| equal to $I_M/C_1$. Meanwhile, curve 203 shows that −VREF tracks the magnitude of +VREF and decreases with the same rate of $I_M/C_1$.

Curves 202 and 203 may be explained as follows. First amplifier 101 has a first transconductance Gm. The voltage difference between the inputs of amplifier 101 multiplied by Gm yields $I_{OUT1}$. If this product is greater than $I_M$, the output of first amplifier 101 is nonetheless limited by $I_M$, which means +VREF increases with the constant rate of $I_M/C_1$.

As +VREF approaches $V_R$, the product of the difference between these two voltages and Gm eventually becomes smaller than $I_M$, and +VREF tends asymptotically to $V_R$ at a smaller, different rate. However, by making Gm large, $I_{OUT1}$ would only become lower than $I_M$ once the difference between +VREF and VR became already very small and hence transition would have occurred at fixed dv/dt over the major part of the transition time.

That is, in some embodiments, +VREF is forced to have a slower behavior, better controlled, with a fixed dv/dt. Because +VREF varies at most as fast as the defined dv/dt, second amplifier 102 needs only to be fast enough to produce −VREF tracking variations limited to this dv/dt in the value +VREF without adding significant delays.

Figure 3:
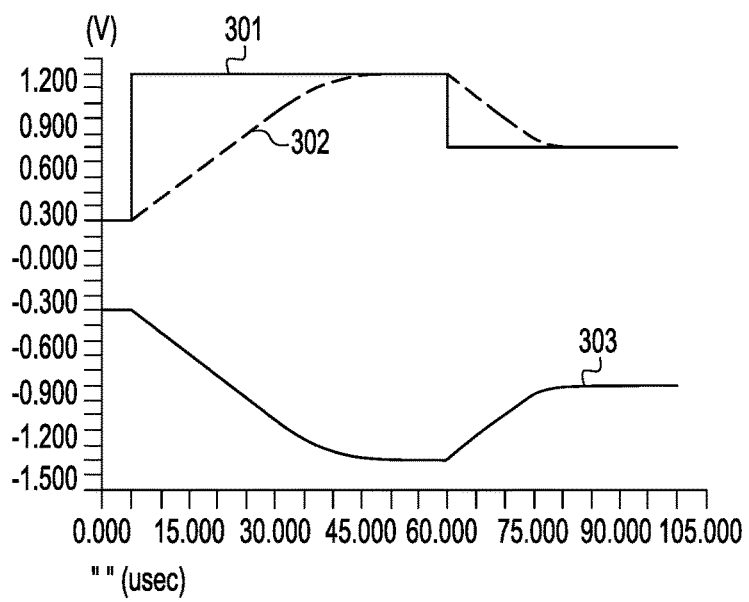
FIG. 3 is a graph illustrating a simulation of reference voltages output by an example implementation of the circuit of FIG. 1, according to some embodiments.

FIG. 3 is a graph 300 illustrating a simulation of reference voltages output by an example implementation of circuit 100 of FIG. 1, according to some embodiments. Again, $V_R$ increases in a step fashion from 0.3 V to 1.3 V shown by curve 301. Curve 302 shows the behavior of +VREF, which increases linearly at the rate of $I_M/C_1$ and then asymptotically to 1.3 V as the value of +VREF approaches $V_R$.

Then $V_R$ is suddenly reduced from 1.3 V to 0.8 V, also in the step fashion shown by curve 301, which in turn causes +VREF to be reduced linearly at the rate of rate of $I_M/C_1$ and then asymptotically to 0.8 V as the value of +VREF again approaches $V_R$. Curve 303 shows the magnitude of −VREF, which is symmetric with respect to +VREF at all times.

Figure 4:
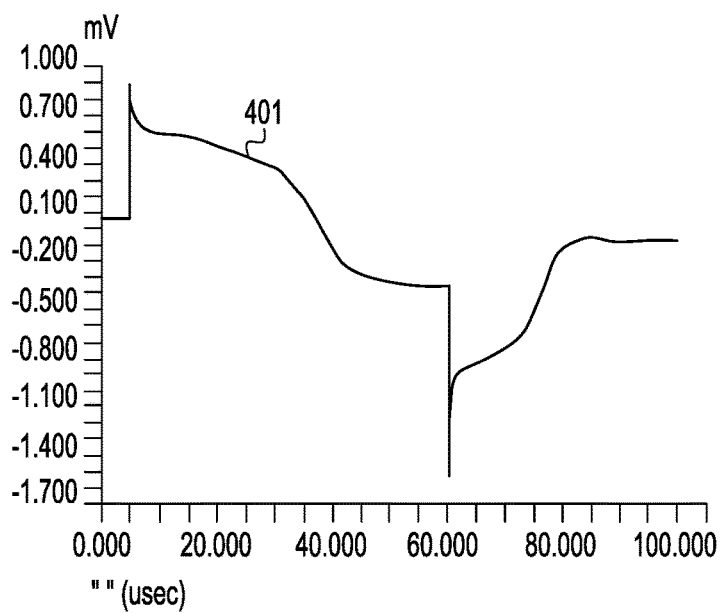
FIG. 4 is a graph illustrating the magnitude of the error defined as the difference between the absolute values of the reference voltages shown in FIG. 3, according to some embodiments.

FIG. 4 is a graph 400 illustrating the magnitude of the error between the reference voltages shown in FIG. 3, according to some embodiments, which is defined as the difference between their absolute values. As shown in curve

401, the magnitude of the difference between +VREF and −VREF absolute values peaks at approximately 0.8 mV when $V_R$ increases from 0.3 V to 1.3 V and peaks at approximately −1.5 mV when $V_R$ decreases to 0.8 V, but it is generally between 0.4 mV and −0.4 mV averaging 0 mV in the absence of changes in $V_R$.

In contrast, conventional circuits that include amplifier configurations with potential for mismatch, charge pumps, and/or other switching circuits, or that rely on matching dynamic parameters of separate MUXes, RC networks, and/or amplifiers, typically result in differences between +VREF and −VREF absolute values several times higher or in much more unfavorable power and area trade-offs.

As described above, in various embodiments, systems and methods described herein may provide a closed-loop structure built around a positive voltage to produce a symmetrically-matched negative voltage, including during transient events. These systems and methods also employ a resistor ladder, MUX, capacitor and an amplifier with design-defined maximum output current limits to generate a range of programmable positive voltage reference levels and to provide smooth level transitions with a selectable dv/dt slew rate. Such systems and methods may be used, for example, to provide precise back-biasing level control in both static and transient forms, and are particularly advantageous for use with Silicon-on-Insulator (SOI) technologies.

As described herein, in an illustrative, non-limiting embodiment, an electronic device may include a first amplifier having a non-inverting input configured to receive a reference voltage and an inverting input coupled to a first output node, where the first amplifier is configured to produce a first output voltage at the first output node; and a second amplifier having a non-inverting input coupled to a ground reference level, and an inverting input coupled to the first output node via a first resistor and to a second output node via a second resistor, where the second amplifier is configured to produce a second output voltage at the second output node. For example, the reference voltage may be selected via a multiplexer coupled to a resistor ladder, and the resistor ladder may be coupled to a reference current source or to a reference voltage source.

The electronic device may also include a low-pass filter coupled to the multiplexer and to the non-inverting input of the first amplifier. The first amplifier may have a first stage configured to output a maximum current at an intermediary node. The first amplifier may also have a capacitor coupled to the intermediary node and to the ground reference level. Moreover, a buffer stage may be coupled to the intermediary node.

In some cases, in response to a positive step change in the reference voltage, the first output voltage may increase at a first rate given by a ratio between the maximum current and a capacitance presented by the capacitor. Additionally or alternatively, the second output voltage may decrease with a second rate having a magnitude equal to the first rate.

In another illustrative, non-limiting embodiment, a dual-reference voltage source may include a first amplifier configured to produce a first reference voltage at a first output node with a first slew rate; and a second amplifier coupled to the first output node and configured to produce a second reference voltage at a second output node with a second slew rate having a magnitude equal to the first slew rate, where the second reference voltage is symmetric with respect to the first reference voltage.

The first amplifier may have a non-inverting input configured to receive a selected voltage and an inverting input coupled to the first output node. The second amplifier may have a non-inverting input coupled to a ground reference level, and an inverting input coupled to the first output node via a first resistor and to the second output node via a second resistor. The selected voltage may be selected via a multiplexer coupled to a resistor ladder, and the resistor ladder may be coupled to a reference current source or to a reference voltage source.

The dual-reference voltage source may also include a low-pass filter coupled to the multiplexer and to the non-inverting input of the first amplifier. The first amplifier may have a first stage configured to output a maximum output current at an intermediary node. The first amplifier may further include a capacitor coupled to the intermediary node and to the ground reference level.

In response to a change in the selected voltage, the first reference voltage may change with the first slew rate given by a ratio between the maximum output current and a capacitance of the capacitor. Additionally or alternatively, the second reference voltage may change in the opposite direction with a second slew rate having a magnitude equal to the first slew rate.

In yet another illustrative, non-limiting embodiment, a method may include: receiving, at a non-inverting input of a first amplifier, a reference voltage, wherein the first amplifier has an inverting input coupled to a first output node; producing a first output voltage at the first output node; and producing a second output voltage symmetric with respect to the first output voltage at a second output node of a second amplifier, where the second amplifier has a non-inverting input coupled to a ground reference level, and an inverting input coupled to the first output node via a first resistor and to the second output node via a second resistor.

In some cases, the first amplifier may have a first stage configured to output a maximum output current at an intermediary node, where the first amplifier further includes a capacitor coupled to the intermediary node and to the ground reference level, and wherein in response to a change in the selected voltage, the first reference voltage increases with a slew rate given by a ratio between the maximum output current and a capacitance of the capacitor. Also, the first resistor may have a first resistance and the second resistor a second resistance, such that a ratio between the first and second resistances is proportional to a ratio between the magnitudes of the first and second output voltages.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic device, comprising:
a first amplifier having a non-inverting input configured to receive a reference voltage and an inverting input coupled to a first output node, wherein the first amplifier is configured to produce a first output voltage at the first output node;
a second amplifier having a non-inverting input coupled to a ground reference level, and an inverting input coupled to the first output node via a first resistor and to a second output node via a second resistor, wherein the second amplifier is configured to produce a second output voltage at the second output node, wherein the reference voltage is selected via a multiplexer coupled to a resistor ladder, and wherein the resistor ladder is coupled to a reference current source or to a reference voltage source; and
a low-pass filter coupled to the multiplexer and to the non-inverting input of the first amplifier.

2. The electronic device of claim 1, wherein the first amplifier has a first stage configured to output a maximum current at an intermediary node.

3. An electronic device, comprising:
a first amplifier having a non-inverting input configured to receive a reference voltage and an inverting input coupled to a first output node, wherein the first amplifier is configured to produce a first output voltage at the first output node;
a second amplifier having a non-inverting input coupled to a ground reference level, and an inverting input coupled to the first output node via a first resistor and to a second output node via a second resistor, wherein the second amplifier is configured to produce a second output voltage at the second output node,
wherein the first amplifier has a first stage configured to output a maximum current at an intermediary node, and wherein the first amplifier further includes a capacitor coupled to the intermediary node and to the ground reference level.

4. The electronic device of claim 3, further comprising a buffer stage coupled to the intermediary node.

5. The electronic device of claim 3, wherein in response to a positive step change in the reference voltage, the first output voltage increases at a first rate given by a ratio between the maximum current and a capacitance presented by the capacitor.

6. The electronic device of claim 5, wherein the second output voltage decreases with a second rate having a magnitude equal to the first rate.

7. A dual-reference voltage source, comprising:
a first amplifier configured to produce a first reference voltage at a first output node with a first slew rate;
a second amplifier coupled to the first output node and configured to produce a second reference voltage at a second output node with a second slew rate having a magnitude equal to the first slew rate, wherein the second reference voltage is symmetric with respect to the first reference voltage, wherein the first amplifier has a non-inverting input configured to receive a selected voltage and an inverting input coupled to the first output node, wherein the selected voltage is selected via a multiplexer coupled to a resistor ladder, and wherein the resistor ladder is coupled to a reference current source or to a reference voltage source; and
a low-pass filter coupled to the multiplexer and to the non-inverting input of the first amplifier.

8. The dual-reference voltage source of claim 7, wherein the second amplifier has a non-inverting input coupled to a ground reference level, and an inverting input coupled to the first output node via a first resistor and to the second output node via a second resistor.

9. The dual-reference voltage source of claim 7, wherein the first amplifier has a first stage configured to output a maximum output current at an intermediary node.

10. A dual-reference voltage source, comprising:
a first amplifier configured to produce a first reference voltage at a first output node with a first slew rate;
a second amplifier coupled to the first output node and configured to produce a second reference voltage at a second output node with a second slew rate having a magnitude equal to the first slew rate, wherein the second reference voltage is symmetric with respect to the first reference voltage, wherein the first amplifier has a non-inverting input configured to receive a selected voltage and an inverting input coupled to the first output node, wherein the first amplifier has a first stage configured to output a maximum output current at an intermediary node, and wherein the first amplifier further includes a capacitor coupled to the intermediary node and to the ground reference level.

11. The dual-reference voltage source of claim 10, wherein, in response to a change in the selected voltage, the first reference voltage changes with the first slew rate given by a ratio between the maximum output current and a capacitance of the capacitor.

12. The dual-reference voltage source of claim 11, wherein the second reference voltage changes in the opposite direction with a second slew rate having a magnitude equal to the first slew rate.

13. A method, comprising:
receiving, at a non-inverting input of a first amplifier, a reference voltage, wherein the first amplifier has an inverting input coupled to a first output node;
producing a first output voltage at the first output node; and
producing a second output voltage symmetric with respect to the first output voltage at a second output node of a second amplifier, wherein the second amplifier has a non-inverting input coupled to a ground reference level, and an inverting input coupled to the first output node via a first resistor and to the second output node via a second resistor, wherein the first amplifier has a first stage configured to output a maximum output current at an intermediary node, wherein the first amplifier further includes a capacitor coupled to the intermediary node and to the ground reference level, and wherein in response to a change in the selected voltage, the first reference voltage increases with a slew rate given by a ratio between the maximum output current and a capacitance of the capacitor.

14. The method of claim 13, wherein the first resistor has a first resistance and the second resistor has a second resistance, and wherein a ratio between the first and second resistances is proportional to a ratio between the magnitudes of the first and second output voltages.

\* \* \* \* \*